(12) United States Patent
Mai et al.

(10) Patent No.: US 9,484,905 B1
(45) Date of Patent: Nov. 1, 2016

(54) VOLTAGE SAMPLING SWITCH AND METHOD THEREFOR

(71) Applicant: FREESCALE SEMICONDUCTOR, INC., Austin, TX (US)

(72) Inventors: Khoi B. Mai, Austin, TX (US); Jon S. Choy, Austin, TX (US); Michael T. Berens, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 15/003,917

(22) Filed: Jan. 22, 2016

(51) Int. Cl.
*G11C 27/02* (2006.01)
*H03K 5/00* (2006.01)
*H03K 17/00* (2006.01)
*H03K 17/06* (2006.01)

(52) U.S. Cl.
CPC .................................. *H03K 17/063* (2013.01)

(58) Field of Classification Search
CPC ... G11C 27/026; G11C 27/024; G11C 27/02; G01R 13/342; H03K 17/063
USPC ...................................................... 327/91–97
See application file for complete search history.

(56) References Cited

U.S. PATENT DOCUMENTS

| 7,385,440 | B2 | 6/2008 | Aksin et al. |
| 7,397,284 | B1 | 7/2008 | Liu |
| 7,940,091 | B1 | 5/2011 | Govindarajulu et al. |
| 8,664,979 | B2 | 3/2014 | Doris et al. |
| 2004/0070439 | A1* | 4/2004 | Sarraj .................... H03K 17/16 327/337 |

OTHER PUBLICATIONS

M. Dessouky and A. Kaiser, "Input Switch Configuration Suitable for Rail-to-Rail Operation of Switched OpAmp Circuits", IEE Electronics Letters, vol. 35, No. 1, pp. 8-9, Jan. 1999.

* cited by examiner

*Primary Examiner* — Quan Tra

(57) ABSTRACT

A voltage switch for handling negative voltages includes an input terminal coupled to a voltage that is greater than a voltage rating of oxide in the voltage switch, a top capacitor plate pre-charge module including three cascoded p-channel transistors coupled between a supply voltage and a top plate of a capacitor, a bottom capacitor plate pre-charge module including two cascoded n-channel transistors coupled between a bottom plate of the capacitor and ground, and an output voltage module including an output terminal and four cascoded n-channel transistors with control electrodes of a first and fourth of the cascoded n-channel transistors coupled to a boost node. Control electrodes of a second and third of the cascoded n-channel transistors coupled to the top plate of the capacitor. A voltage switch for positive voltages is also disclosed.

20 Claims, 3 Drawing Sheets

VOLTAGE SAMPLING SWITCH AND METHOD THEREFOR

BACKGROUND

1. Field

This disclosure relates generally to circuits, and more specifically, to a voltage sampling switch circuit and method therefor.

2. Related Art

Board level system developers are increasingly challenged as semiconductor process technology advances for modern integrated circuits (ICs). For example, a system may include multiple ICs assembled on a common printed circuit board (PCB). The multiple ICs are likely to be sourced from different manufacturers and processed in various process technologies. Operating voltages supplied to the multiple ICs are generally based on the process technology of each IC and reflected in the manufacturer's specifications. For example, one IC may require 5.0 volts to operate, while another IC may require 3.6 volts to operate, and so on. The system PCB design typically includes electrical traces which route appropriate supply voltages to each IC.

System manufacturers may qualify a particular PCB design having a corresponding set of ICs, and continue to use the PCB design and set of ICs for several years for a given product or family of products. Advances in process technology enable smaller transistor features which may in turn allow for one or more ICs in the set to realize cost reductions. However, smaller transistor usually require a lower operating voltage. For the system manufacturers to gain advantages by replacing an IC with a lower cost IC manufactured at a more advanced process technology, a new system PCB design could be required to route the appropriate lower voltage to the lower cost IC. Design changes to the PCB would likely require a requalification of the system, impacting production and incurring significant costs. As such, there is a need for ICs to be processed in an advanced technology without impacting the supply voltage requirements of the ICs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an input voltage sampling switch which samples input voltages significantly higher than the operating supply voltage of the switch while protecting transistors of the switch from receiving voltages beyond an oxide voltage rating of the transistors.

Figure 1:
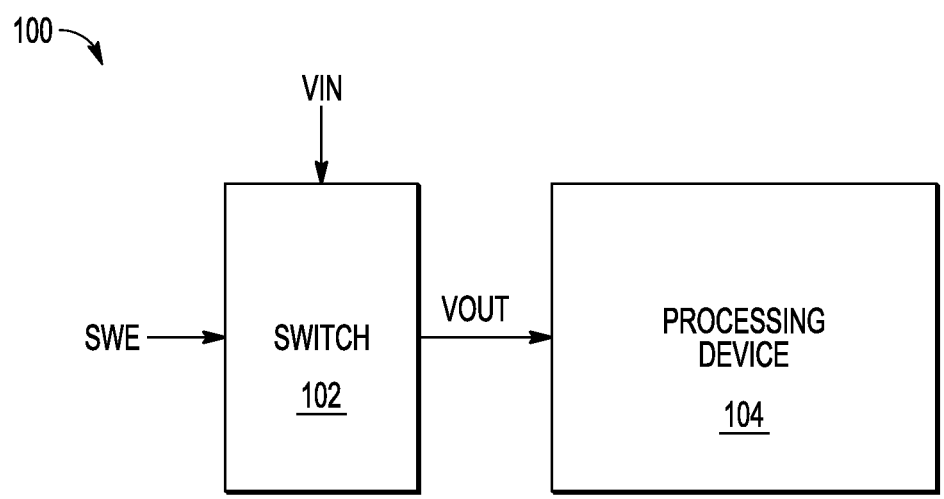
FIG. 1 illustrates, in simplified block diagram form, a processing system in accordance with an embodiment of the present disclosure.

FIG. 1 illustrates, in simplified block diagram form, processing system 100 in accordance with an embodiment of the present disclosure. Processing system 100 may be an integrated circuit implemented using a CMOS process. In one embodiment, processing system 100 is a system-on-a-chip (SoC). Processing system 100 includes an input voltage sampling switch circuit 102 coupled to processing device 104. The switch circuit 102 receives a switch enable signal labeled SWE and an input voltage signal labeled VIN, and provides an output voltage signal labeled VOUT. Processing device 104 is coupled to receive the VOUT signal at an input. Processing device 104 may be any type of processing device such as analog-to-digital converter (ADC), switched-capacitor analog filter, sample and hold circuitry, and the like.

Figure 2:
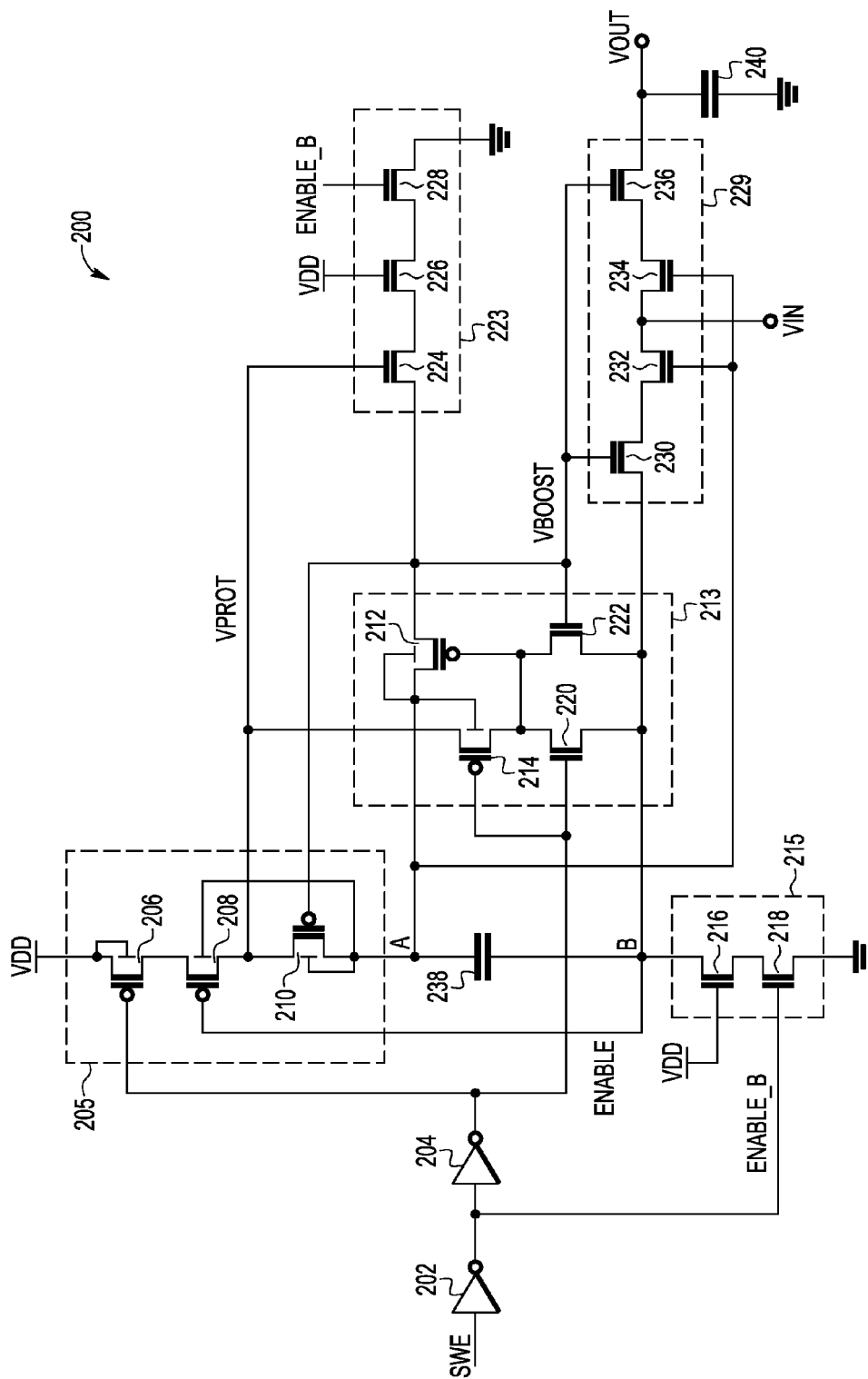
FIG. 2 illustrates, in schematic diagram form, an input voltage sampling switch in accordance with an embodiment of the present disclosure.

FIG. 2 illustrates, in schematic diagram form, an exemplary input voltage sampling switch circuit 200 in accordance with an embodiment of the present disclosure. Switch circuit 200 receives the switch enable signal labeled SWE at a first input and receives the input voltage signal VIN at the input terminal labeled VIN. The VIN voltage may exceed a voltage rating for at least some transistors in the switch circuit 200. Based on the SWE signal and the VIN signal, switch circuit 200 provides the output voltage signal VOUT at output terminal labeled VOUT. Switch circuit 200 includes a first pre-charge circuit 205, a second pre-charge circuit 215, output disable circuitry 223, output switch circuitry 229, boost transfer circuitry 213, a boost capacitor 238, a load capacitor 240, SWE signal inverters 202 and 204, a first supply voltage labeled VDD, and a second voltage supply (ground).

The SWE signal generally toggles between ground and VDD voltages. The VDD voltage may be a voltage similar to the voltage provided to operating circuitry in the processing system 100, for example, 1.8V. Inverter 202 receives the SWE signal at an input and generates a complement signal ENABLE_B at an output coupled to node labeled ENABLE_B. Inverter 204 receives the ENABLE_B signal at an input and generates a buffered or true version of the switch enable signal ENABLE at an output coupled to node labeled ENABLE. The ENABLE and ENABLE_B signals are provided to circuitry within the switch circuit 200. In some embodiments, the SWE signal may be a periodic signal such as a clock signal.

The first pre-charge circuit 205 includes P-channel transistors 206-210 coupled in series between the first supply voltage and a first terminal or top plate of boost capacitor 238. Capacitor 238 may be any capacitive element and may be formed with any suitable materials and structures available in a given process technology such as metal-oxide-semiconductor (MOS) capacitors, metal-oxide-metal (MOM) capacitors, metal-insulator-metal (MIM) capacitors, polysilicon-insulator-polysilicon (PIP) capacitors, deep trench capacitors, and the like, for example. The P-channel transistors 206-210 are configured to form a first set of cascoded transistors. In the first set, a first current electrode or source electrode of transistor 206 is coupled to the first supply voltage VDD, a second current electrode of transistor 206 is coupled to a first current electrode of transistor 208, a control electrode of transistor 206 is coupled to receive the ENABLE signal at the output of inverter 204, and a body terminal of transistor 206 is coupled to the VDD voltage supply. A second current electrode of transistor 208 is coupled to a first current electrode of transistor 210, a first current electrode of transistor 214 and a control electrode of transistor 224 at node VPROT. The voltage generated at node VPROT protects transistors 214 and 224 from receiving a voltage beyond an oxide voltage rating of the transistors. A second current electrode or drain electrode of transistor 210 is coupled to the top plate of capacitor 238, to a first current electrode of transistor 212, to a control electrode of transistor 232, and to a control electrode of transistor 236 at node A. Body terminals of P-channel transistors 208-214 are coupled to each other at node A such that the body voltage of each of transistors 208-214 corresponds to the voltage at node A.

The second pre-charge circuit 215 includes N-channel transistors 216 and 218 coupled in series between the second supply voltage and a second terminal or bottom plate of boost capacitor 238. The N-channel transistors 216-218 are configured to form a second set of cascoded transistors. In the second set, a first current electrode of transistor 216 is coupled to the bottom plate of capacitor 238, to a control electrode of transistor 208, to a first current electrode of transistor 220, to a first current electrode of transistor 222, and to a first current electrode of transistor 230, at node labeled B. A second current electrode of transistor 216 is coupled to a first current electrode of transistor 218. A control electrode of transistor 216 is coupled to the first supply voltage VDD and a second current electrode of transistor 218 is coupled to the second supply voltage shown as ground. A control electrode of transistor 218 is coupled to receive the ENABLE_B signal.

The boost transfer circuitry 213 includes P-channel transistors 212 and 214 and N-channel transistors 220 and 222. A second current electrode of transistor 212 is coupled to a control electrode of transistor 222, to a control electrode of transistor 210, to a control electrode of transistor 230, to a control electrode of transistor 236, and to a first current electrode or drain electrode of transistor 224 at node labeled VBOOST. A control electrode of transistor 212 is coupled to a second current electrode of transistor 214, to a second current electrode of transistor 220, and to a second current electrode of transistor 222. A control electrode of transistor 214 and a control electrode of transistor 220 are each coupled to receive the ENABLE signal at the output of inverter 204.

The output disable circuitry 223 includes N-channel transistors 224-228 coupled in series between the second supply voltage and the VBOOST node. The N-channel transistors 224-228 are configured to form a third set of cascoded transistors. In the third set, a second current electrode of transistor 224 is coupled to a first current electrode of transistor 226, and a second current electrode of transistor 226 is coupled to a first current electrode of transistor 228. A second current electrode or source electrode of transistor 228 is coupled to the second supply voltage. The control electrode of transistor 226 is coupled to the first supply voltage, and the control electrode of transistor 228 is coupled to receive the ENABLE_B signal.

The output switch circuitry 229 includes N-channel transistors 230-236 coupled in series between the VOUT terminal and node B. The N-channel transistors 230-236 are configured to form a fourth set of cascoded transistors. In the fourth set, a second current electrode of transistor 230 is coupled to a first current electrode of transistor 232, and a second current electrode of transistor 232 is coupled to a first current electrode of transistor 234. A second current electrode of transistor 234 is coupled to a first current electrode of transistor 236, and a second current electrode of transistor 236 is coupled to the VOUT terminal. The control electrodes of transistors 230 and 236 are each coupled to node VBOOST, and the control electrodes of transistors 233 and 234 are each coupled to node A. Load capacitor 240 is coupled to VOUT terminal. Load capacitor 240 may be intrinsic capacitance of circuitry coupled to the VOUT terminal. Load capacitor 240 may be any combination of intrinsic capacitance of circuitry, parasitic capacitance, and capacitive elements such MOS capacitors, MOM capacitors, MIM capacitors, PIP capacitors, and the like coupled to the VOUT terminal.

Figure 3:
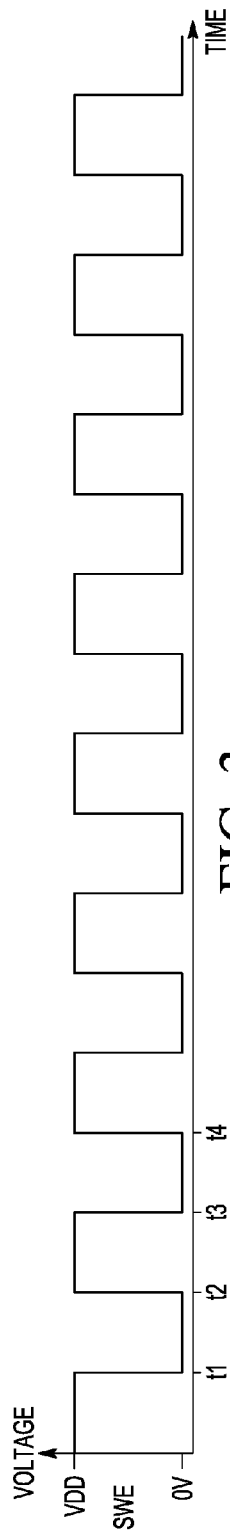
FIGS. 3-5 illustrate, in timing diagram form, various waveforms of the input voltage sampling switch in accordance with an embodiment of the present disclosure.
Figure 4:
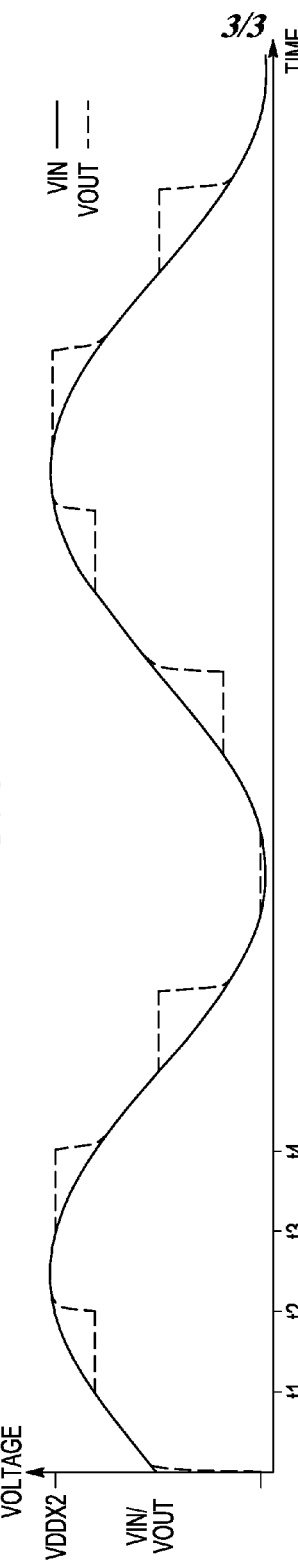
Figure 5:
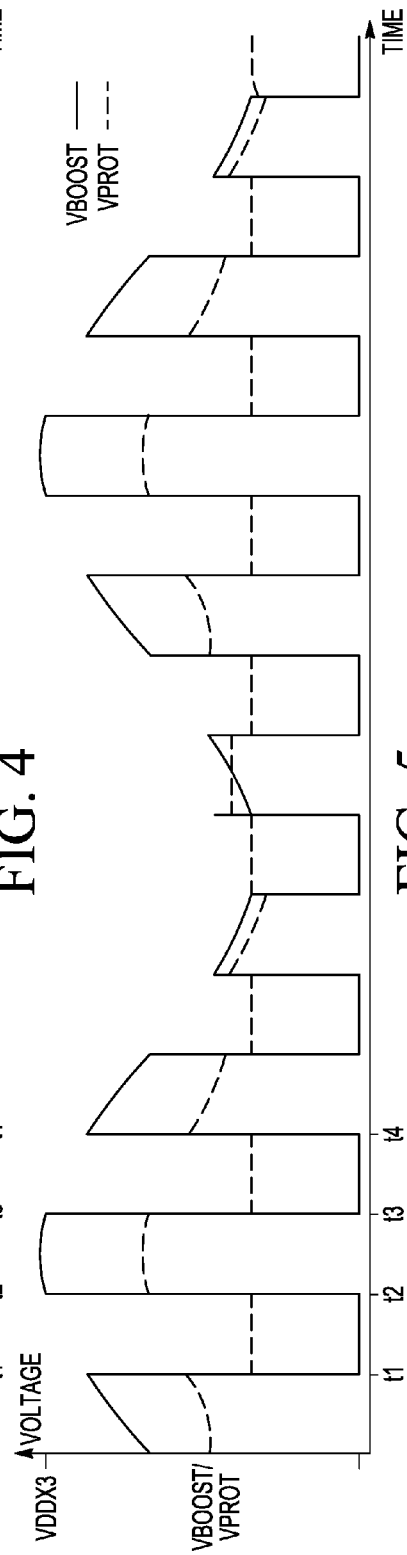

FIGS. 3-5 illustrate, in timing diagram form, various waveforms of the exemplary input voltage sampling switch circuit 200 in accordance with an embodiment of the present disclosure. FIG. 3 illustrates an exemplary timing waveform of the switch enable signal SWE including timing markers t1-t4. The SWE signal is a digital signal that toggles between ground and VDD voltages, and has a periodic waveform much like a clock signal, for example. The switch circuit 200 can operate in a pre-charge mode of operation shown as t1-t2 and t3-t4 in the SWE waveform and in a boost mode of operation shown as t2-t3 in the SWE waveform.

FIG. 4 illustrates exemplary input voltage VIN and output voltage VOUT waveforms including timing markers t1-t4 corresponding to timing markers t1-t4 of the SWE signal illustrated in FIG. 3. In this example, VIN is an analog signal that may vary between two times VDD (VDDX2) and 0 volts or ground voltages. VOUT is the output voltage signal of the switch circuit 200 corresponding to voltages sampled at the input labeled VIN of the switch circuit 200.

FIG. 5 illustrates exemplary VBOOST and VPROT internal nodes voltage waveforms including timing markers t1-t4 corresponding to timing markers t1-t4 of the SWE signal illustrated in FIG. 3. In this example, VBOOST is an analog signal at the internal node labeled VBOOST and corresponds to the VIN signal during boost phases of operation. During a boost phase, the VBOOST signal may vary between approximately three times VDD (VDDX3) and VDD voltages. The VBOOST signal may be at a voltage approximately equal to 0 volts or ground during the pre-charge phases of operation. VPROT is an analog signal at the internal node labeled VPROT and corresponds to the VIN signal during boost phases of operation. During a boost phase, the VPROT signal may vary between approximately two times VDD and VDD voltages. The VPROT signal may be at a voltage approximately equal to VDD during the pre-charge phases of operation of switch circuit 200.

Operation of the exemplary input voltage sampling switch circuit 200 is described further by way of example. At time t1 in FIG. 3, switch enable signal SWE is de-asserted as a logic low causing the switch circuit 200 to be in a pre-charge phase of operation. During the pre-charge phase, the transistors of the first pre-charge circuit 205 and the transistors of the second pre-charge circuit 215 are turned on, pre-charging boost capacitor 238 to an initial voltage. In this example, VIN is an analog signal that may vary between two times VDD (VDDX2) and 0 volts or ground voltages. The output switch circuitry 229 is configured in an off state, isolating VIN from VOUT. While the output switch circuitry 229 is configured in the off state, the voltage at VOUT corresponds to a voltage stored on load capacitor 240. At corresponding time t1 shown in FIG. 5, VPROT is pre-charged to a voltage approximately equal to VDD and VBOOST is pre-charged to a voltage approximately equal to 0 volts or ground.

At time t2 in FIG. 3, switch enable signal SWE is asserted as a logic high causing the switch circuit 200 to be in a boost phase of operation. During the boost phase of operation, a transistor in each of the first pre-charge circuit 205, the second pre-charge circuit 215, and the disable circuitry 223 is turned off, isolating the circuits 205, 215, and 223 from the first supply voltage (VDD) and from the second supply voltage (ground) respectively. A voltage stored on boost capacitor 238 is coupled to the VPROT and VBOOST nodes accordingly. Because transistors 230-236 of the output switch circuitry 229 are in the on state during the boost phase, a voltage VIN at the VIN input is sampled and provided at the output labeled VOUT. As the voltage VIN changes while in the boost phase, the voltages VPROT and VBOOST track with the VIN voltage, providing transistor voltages within allowable voltage tolerances specified for a given process technology. In this example, VIN may vary between two times VDD (VDDX2) and 0 volts or ground voltages. During the boost phase, VPROT will vary between approximately two times VDD and VDD voltages, and VBOOST will vary between approximately three times VDD (VDDX3) and VDD voltages as the VPROT and VBOOST signals track VIN.

At time t3 in FIG. 3, the boost phase ends as the SWE signal is de-asserted as a logic low and a next pre-charge phase begins. At the end of the boost phase, a voltage stored on the load capacitor 240 can be sustained throughout the next pre-charge phase. The next pre-charge phase ends at t4 as the SWE signal is asserted as a logic high, beginning a next boost phase.

By now it should be appreciated that there has been provided, an input voltage sampling switch which samples input voltages significantly higher than the operating supply voltage of the switch while protecting transistors of the switch from receiving voltages beyond an oxide voltage rating of the transistors.

Generally, there is provided, an input voltage sampling switch including: an input voltage terminal for receiving an input voltage, wherein the input voltage is higher than a voltage rating for at least some transistors in the input voltage sampling switch; a first capacitor including a top plate and a bottom plate; a top capacitor plate pre-charging circuit including three cascoded transistors, a first of the three cascoded transistors includes a source electrode coupled to a supply voltage, a second of the three cascoded transistors is coupled between the first and third of the three cascoded transistors and a control electrode of the second of the three cascoded transistors is coupled to the bottom plate of the first capacitor, and a third of the three cascoded transistors includes a source electrode coupled to the top plate of the first capacitor; a first node located between the top plate of the first capacitor and the source electrode of the third of the three cascoded transistors; an output switch; and an output voltage terminal coupled to the input voltage terminal through an output switch, wherein operation of the output switch is controlled in part by an output of the top capacitor plate pre-charging circuit at the first node. The input voltage sampling switch may further include a boost node coupled to the first node through a boost select switch; and an output disable circuit including fourth, fifth and sixth cascoded transistors, the fourth cascoded transistor includes a drain electrode coupled to the boost node; the fifth cascoded transistor is coupled between the fourth and sixth cascoded transistors; and the sixth cascoded transistor includes a source electrode coupled to ground. The fourth cascoded transistor of the output disable circuit may include a control electrode coupled to a drain electrode of the second of the cascoded transistors in the top capacitor plate pre-charging circuit; the fifth cascoded transistor may include a control electrode coupled to a supply voltage; and the sixth cascoded transistor may include a control electrode coupled to a complement of a switch enable signal. The output circuit may include seventh, eighth, ninth and tenth cascoded transistors, the seventh cascoded transistor may include a drain electrode coupled to the bottom plate of the first capacitor; the eighth cascoded transistor may be coupled between the seventh and ninth cascoded transistors; the ninth cascoded transistor may be coupled between the eighth and tenth cascoded transistors; the tenth cascoded transistor may include a source electrode coupled to output voltage. The input voltage sampling switch may further include a boost node coupled to the first node through a boost select switch, wherein the seventh and tenth cascoded transistors may include a control electrode coupled to the boost node; and the eighth and ninth cascoded transistors may include a control electrode coupled to the first node. The input voltage sampling switch may further include a bottom capacitor plate pre-charge circuit including eleventh transistor and twelfth cascoded transistors, wherein the eleventh cascoded transistor may include a first current electrode coupled to the bottom plate of the first capacitor, a second current electrode coupled to a first current electrode of the twelfth cascoded transistor, and a control electrode coupled to a supply voltage, and the twelfth cascoded transistor may include a second current electrode coupled to ground and a control electrode coupled to a complement of a switch enable signal. The input voltage sampling switch may further include a boost transfer circuit including a thirteenth transistor including a first current electrode coupled to the source of the second of the cascoded transistors in the top capacitor plate pre-charge switch, a second current electrode coupled to a first current electrode of a fourteenth transistor, and a control electrode coupled to an enable signal, and the fourteenth transistor including a second current electrode coupled to the bottom plate of the first capacitor and a control electrode coupled to the enable signal. The boost transfer circuit may further includes a boost select switch including a first current electrode coupled to the first node, a second current electrode coupled to an output disable circuit, and a control electrode coupled to the second current electrode of the thirteenth transistor. The boost transfer circuit may further includes a fifteenth transistor including a second current electrode coupled to the bottom plate of the first capacitor and a control electrode coupled to a boost node at the second current electrode of the boost select switch. The input voltage sampling switch may further include the first of the three cascoded transistors of the top capacitor plate pre-charging circuit includes a control electrode coupled to the enable signal; and the third of the three cascoded transistors of the top capacitor plate pre-charging circuit includes a control electrode coupled to the boost node.

In another embodiment, there is provided, a method including: providing an input voltage to an input terminal of an input voltage sampling switch, wherein the input terminal is coupled to an output voltage switch and the input voltage may be higher than a voltage rating of gate oxide for transistors in the input voltage sampling switch and the output voltage switch, wherein the output voltage switch includes four cascoded transistors, a first of the four cascoded transistors may include a first current electrode coupled to a bottom plate of a capacitor, a second current electrode coupled to a first current electrode of the second of the four cascoded transistors, and a control electrode coupled to a boost node; a second and third of the four cascoded transistors are coupled between the first and a fourth of the four cascoded transistors, a control electrode of the second and third of the four cascoded transistors is coupled to a top plate of the capacitor; and the fourth of the four cascoded transistors may include a control electrode coupled to the boost node, a first current electrode coupled to the third of the four cascoded transistors, and a second current electrode configured as an output terminal of the input voltage sampling switch; when an enable signal is not asserted, pre-charging the capacitor to a supply voltage within the voltage rating of the gate oxide; and disabling the output voltage switch; and when the enable signal is asserted, using the capacitor to boost voltage at the boost node to a level above the input voltage; and enabling the output voltage switch. The method may further include when the enable signal is not asserted, applying the supply voltage to the top plate of the capacitor through three cascoded p-channel transistors. The method may further include when the enable signal is not asserted, placing the first and fourth of the four cascoded transistors in the output voltage switch in non-conductive mode, and coupling the second and third of the four cascoded transistors in the output voltage switch to a supply voltage. The output voltage switch may be disabled by placing three cascoded transistors in the output disable switch in a conductive mode, wherein the output disable switch may include fifth, sixth and seventh cascoded transistors, the fifth cascoded transistor includes a drain electrode coupled to a boost node; the sixth cascoded transistor is coupled between the fifth and seventh cascoded transistors; and the seventh cascoded transistor includes a source electrode coupled to ground. The fifth cascoded transistor of the output disable circuit may include a control electrode coupled to a drain electrode of the second of the cascoded transistors in the top capacitor plate pre-charging circuit; the sixth cascoded transistor may include a control electrode coupled to the supply voltage; and the seventh cascoded transistor may include a control electrode coupled to a complement of the enable signal. A first of the three cascoded p-channel transistors may include a source electrode coupled to the supply voltage, a second of the three cascoded p-channel transistors is coupled between the first and third of the three cascoded p-channel transistors and a control electrode of the second of the three cascoded p-channel transistors is coupled to the bottom plate of the capacitor, and a third of the three cascoded p-channel transistors includes a source electrode coupled to the top plate of the capacitor.

In yet another embodiment, there is provided, an integrated circuit device including: a voltage switch including an input terminal coupled to a voltage that is greater than a voltage rating of oxide in the voltage switch; a top capacitor plate pre-charge module including three cascoded p-channel transistors coupled between a supply voltage and a top plate of a capacitor; a bottom capacitor plate pre-charge module including two cascoded n-channel transistors coupled between a bottom plate of the capacitor and ground; and an output voltage module including an output terminal and four cascoded n-channel transistors with control electrodes of a first and fourth of the cascoded n-channel transistors coupled to a boost node, and control electrodes of a second and third of the cascoded n-channel transistors coupled to the top plate of the capacitor. The integrated circuit device may further include a boost transfer circuit including a fifth transistor including a first current electrode coupled to a drain of the second of the cascoded transistors in the top capacitor plate pre-charge module, a second current electrode coupled to a first current electrode of a sixth transistor, and a control electrode coupled to an enable signal, and the sixth transistor including a second current electrode coupled to the bottom plate of the capacitor and a control electrode coupled to the enable signal. The boost transfer circuit may further includes a boost select switch including a first current electrode coupled to the top plate of the capacitor, a second current electrode coupled to the output disable module, and a control electrode coupled to the second current electrode of the fifth transistor, and a seventh transistor including a first current electrode coupled to the second current electrode of the fifth transistor, a second current electrode coupled to the bottom plate of the capacitor and a control electrode coupled to a boost node at the second current electrode of the boost select switch. The integrated circuit device may further include one of a group consisting of a processor and an analog to digital converter coupled to the output terminal of the voltage switch.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An input voltage sampling switch, comprising:
   an input voltage terminal for receiving an input voltage, wherein the input voltage is higher than a voltage rating for at least some transistors in the input voltage sampling switch;
   a first capacitor including a top plate and a bottom plate;
   a top capacitor plate pre-charging circuit including three cascoded transistors,
      a first of the three cascoded transistors includes a source electrode coupled to a supply voltage,
      a second of the three cascoded transistors is coupled between the first and third of the three cascoded transistors and a control electrode of the second of the three cascoded transistors is coupled to the bottom plate of the first capacitor, and
      a third of the three cascoded transistors includes a source electrode coupled to the top plate of the first capacitor;
   a first node located between the top plate of the first capacitor and the source electrode of the third of the three cascoded transistors;
   an output switch; and
   an output voltage terminal coupled to the input voltage terminal through an output switch, wherein operation of the output switch is controlled in part by an output of the top capacitor plate pre-charging circuit at the first node.

2. The input voltage sampling switch of claim 1 further comprising:
   a boost node coupled to the first node through a boost select switch; and
   an output disable circuit including fourth, fifth and sixth cascoded transistors,
      the fourth cascoded transistor includes a drain electrode coupled to the boost node;
      the fifth cascoded transistor is coupled between the fourth and sixth cascoded transistors; and
      the sixth cascoded transistor includes a source electrode coupled to ground.

3. The input voltage sampling switch of claim 2 wherein:
   the fourth cascoded transistor of the output disable circuit includes a control electrode coupled to a drain electrode of the second of the cascoded transistors in the top capacitor plate pre-charging circuit;
   the fifth cascoded transistor includes a control electrode coupled to a supply voltage; and
   the sixth cascoded transistor includes a control electrode coupled to a complement of a switch enable signal.

4. The input voltage sampling switch of claim 1 wherein:
   the output circuit includes seventh, eighth, ninth and tenth cascoded transistors,
      the seventh cascoded transistor includes a drain electrode coupled to the bottom plate of the first capacitor;
      the eighth cascoded transistor is coupled between the seventh and ninth cascoded transistors;
      the ninth cascoded transistor is coupled between the eighth and tenth cascoded transistors; and
      the tenth cascoded transistor includes a source electrode coupled to output voltage.

5. The input voltage sampling switch of claim 4 further comprising:
   a boost node coupled to the first node through a boost select switch, wherein
   the seventh and tenth cascoded transistors include a control electrode coupled to the boost node; and
   the eighth and ninth cascoded transistors include a control electrode coupled to the first node.

6. The input voltage sampling switch of claim 1 further comprising:
   a bottom capacitor plate pre-charge circuit including:
      eleventh transistor and twelfth cascoded transistors, wherein:
      the eleventh cascoded transistor includes a first current electrode coupled to the bottom plate of the first capacitor, a second current electrode coupled to a first current electrode of the twelfth cascoded transistor, and a control electrode coupled to a supply voltage, and
      the twelfth cascoded transistor includes a second current electrode coupled to ground and a control electrode coupled to a complement of a switch enable signal.

7. The input voltage sampling switch of claim 1 further comprising:
   a boost transfer circuit including:
      a thirteenth transistor including a first current electrode coupled to the source of the second of the cascoded transistors in the top capacitor plate pre-charge switch, a second current electrode coupled to a first current electrode of a fourteenth transistor, and a control electrode coupled to an enable signal, and
      the fourteenth transistor including a second current electrode coupled to the bottom plate of the first capacitor and a control electrode coupled to the enable signal.

8. The input voltage sampling switch of claim 7 wherein the boost transfer circuit further includes:
   a boost select switch including a first current electrode coupled to the first node, a second current electrode coupled to an output disable circuit, and a control electrode coupled to the second current electrode of the thirteenth transistor.

9. The input voltage sampling switch of claim 8 wherein the boost transfer circuit further includes:
a fifteenth transistor including a second current electrode coupled to the bottom plate of the first capacitor and a control electrode coupled to a boost node at the second current electrode of the boost select switch.

10. The input voltage sampling switch of claim 1 further comprising:
the first of the three cascoded transistors of the top capacitor plate pre-charging circuit includes a control electrode coupled to the enable signal; and
the third of the three cascoded transistors of the top capacitor plate pre-charging circuit includes a control electrode coupled to the boost node.

11. A method comprising:
providing an input voltage to an input terminal of an input voltage sampling switch, wherein the input terminal is coupled to an output voltage switch and the input voltage is higher than a voltage rating of gate oxide for transistors in the input voltage sampling switch and the output voltage switch, wherein the output voltage switch includes four cascoded transistors,
a first of the four cascoded transistors includes a first current electrode coupled to a bottom plate of a capacitor, a second current electrode coupled to a first current electrode of the second of the four cascoded transistors, and a control electrode coupled to a boost node;
a second and third of the four cascoded transistors are coupled between the first and a fourth of the four cascoded transistors, a control electrode of the second and third of the four cascoded transistors is coupled to a top plate of the capacitor; and
the fourth of the four cascoded transistors includes a control electrode coupled to the boost node, a first current electrode coupled to the third of the four cascoded transistors, and a second current electrode configured as an output terminal of the input voltage sampling switch;
when an enable signal is not asserted,
pre-charging the capacitor to a supply voltage within the voltage rating of the gate oxide; and
disabling the output voltage switch; and
when the enable signal is asserted,
using the capacitor to boost voltage at the boost node to a level above the input voltage; and
enabling the output voltage switch.

12. The method of claim 11 further comprising:
when the enable signal is not asserted,
applying the supply voltage to the top plate of the capacitor through three cascoded p-channel transistors.

13. The method of claim 12 further comprising:
when the enable signal is not asserted,
placing the first and fourth of the four cascoded transistors in the output voltage switch in non-conductive mode, and
coupling the second and third of the four cascoded transistors in the output voltage switch to a supply voltage.

14. The method of claim 11 wherein the output voltage switch is disabled by placing three cascoded transistors in the output disable switch in a conductive mode,
wherein the output disable switch includes fifth, sixth and seventh cascoded transistors,
the fifth cascoded transistor includes a drain electrode coupled to a boost node;
the sixth cascoded transistor is coupled between the fifth and seventh cascoded transistors; and
the seventh cascoded transistor includes a source electrode coupled to ground.

15. The method of claim 14 wherein:
the fifth cascoded transistor of the output disable circuit includes a control electrode coupled to a drain electrode of the second of the cascoded transistors in the top capacitor plate pre-charging circuit;
the sixth cascoded transistor includes a control electrode coupled to the supply voltage; and
the seventh cascoded transistor includes a control electrode coupled to a complement of the enable signal.

16. The method of claim 12 wherein:
a first of the three cascoded p-channel transistors includes a source electrode coupled to the supply voltage,
a second of the three cascoded p-channel transistors is coupled between the first and third of the three cascoded p-channel transistors and a control electrode of the second of the three cascoded p-channel transistors is coupled to the bottom plate of the capacitor, and
a third of the three cascoded p-channel transistors includes a source electrode coupled to the top plate of the capacitor.

17. An integrated circuit device comprising:
a voltage switch including:
an input terminal coupled to a voltage that is greater than a voltage rating of oxide in the voltage switch;
a top capacitor plate pre-charge module including three cascoded p-channel transistors coupled between a supply voltage and a top plate of a capacitor;
a bottom capacitor plate pre-charge module including two cascoded n-channel transistors coupled between a bottom plate of the capacitor and ground; and
an output voltage module including an output terminal and four cascoded n-channel transistors with control electrodes of a first and fourth of the cascoded n-channel transistors coupled to a boost node, and control electrodes of a second and third of the cascoded n-channel transistors coupled to the top plate of the capacitor.

18. The integrated circuit device of claim 17 further comprising:
a boost transfer circuit including:
a fifth transistor including a first current electrode coupled to a drain of the second of the cascoded transistors in the top capacitor plate pre-charge module, a second current electrode coupled to a first current electrode of a sixth transistor, and a control electrode coupled to an enable signal, and
the sixth transistor including a second current electrode coupled to the bottom plate of the capacitor and a control electrode coupled to the enable signal.

19. The integrated circuit device of claim 18 wherein the boost transfer circuit further includes:
a boost select switch including a first current electrode coupled to the top plate of the capacitor, a second current electrode coupled to the output disable module, and a control electrode coupled to the second current electrode of the fifth transistor, and
a seventh transistor including a first current electrode coupled to the second current electrode of the fifth transistor, a second current electrode coupled to the bottom plate of the capacitor and a control electrode coupled to a boost node at the second current electrode of the boost select switch.

20. The integrated circuit device of claim 16 further comprising one of a group consisting of a processor and an analog to digital converter coupled to the output terminal of the voltage switch.

\* \* \* \* \*